US012588545B2

(12) United States Patent
Ory et al.

(10) Patent No.:     US 12,588,545 B2
(45) Date of Patent:       Mar. 24, 2026

(54) ELECTRONIC CHIP WITH CONTACTS

(71) Applicant: STMICROELECTRONICS (TOURS) SAS, Tours (FR)

(72) Inventors: Olivier Ory, Tours (FR); Michael De Cruz, Monnaie (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 520 days.

(21) Appl. No.: 17/896,707

(22) Filed: Aug. 26, 2022

(65) Prior Publication Data

US 2023/0068222 A1     Mar. 2, 2023

(30) Foreign Application Priority Data

Aug. 31, 2021     (FR) ..................................... 21/09092

(51) Int. Cl.
*H01L 23/31*          (2006.01)
*H01L 23/00*          (2006.01)

(52) U.S. Cl.
CPC .......... *H01L 23/3114* (2013.01); *H01L 24/05* (2013.01); *H01L 24/13* (2013.01); *H01L 24/18* (2013.01); *H01L 2224/05569* (2013.01); *H01L 2224/12105* (2013.01); *H01L 2924/18162* (2013.01)

(58) Field of Classification Search
CPC ..... H01L 23/3114; H01L 24/05; H01L 24/13; H01L 24/18; H01L 24/03; H01L 2224/05569; H01L 2224/12105; H01L 2924/18162; H01L 21/568; H01L 21/78
See application file for complete search history.

(56) References Cited

U.S. PATENT DOCUMENTS

| | | | |
|---|---|---|---|
| 4,640,721 | A | 2/1987 | Uehara et al. |
| 5,428,248 | A | 6/1995 | Cha |
| 5,606,198 | A | 2/1997 | Ono et al. |
| 5,770,888 | A | 6/1998 | Song et al. |

(Continued)

FOREIGN PATENT DOCUMENTS

| | | |
|---|---|---|
| CN | 1812075 A | 8/2006 |
| CN | 1835196 B | 9/2006 |

(Continued)

OTHER PUBLICATIONS

Ganjei, John, "Improved QFN Reliability by Flank Tin Plating Process after Singulation," 10th International Microsystems, Packaging, Assembly and Circuits Technology Conference (IMPACT), Taipei, TW, pp. 137-140 (Year: 2015).*

*Primary Examiner* — Fernando L Toledo
*Assistant Examiner* — Ryan T. Fortin
(74) *Attorney, Agent, or Firm* — Seed IP Law Group LLP

(57)          ABSTRACT

The present disclosure relates to at least one embodiment of an electronic chip that includes an integrated circuit formed in and on a semiconductor substrate. The flanks of the substrate being coated with a second protective resin. The electronic chip further includes at least one metal contact arranged on a first face of the semiconductor substrate and extending laterally beyond the flanks of the second protective resin. Said at least one metal contact may have a flat connection face extending continuously in part under the semiconductor substrate and extending laterally beyond the flanks of the second protective resin.

20 Claims, 3 Drawing Sheets

(56) References Cited

U.S. PATENT DOCUMENTS

| | | | |
|---|---|---|---|
| 5,910,687 | A | 6/1999 | Chen et al. |
| 5,998,877 | A | 12/1999 | Ohuchi |
| 6,326,689 | B1 | 12/2001 | Thomas |
| 6,498,099 | B1 | 12/2002 | McLellan et al. |
| 7,935,568 | B2 | 5/2011 | Oganesian et al. |
| 8,278,213 | B2 | 10/2012 | Kameyama et al. |
| 8,551,815 | B2 | 10/2013 | Avsian et al. |
| 9,177,836 | B1* | 11/2015 | Liu .................. H01L 23/49555 |
| 11,393,785 | B2 | 7/2022 | Fallourd et al. |
| 2003/0067001 | A1 | 4/2003 | Poo et al. |
| 2005/0095750 | A1 | 5/2005 | Lo et al. |
| 2006/0012967 | A1 | 1/2006 | Asai et al. |
| 2006/0170112 | A1 | 8/2006 | Tanaka et al. |
| 2007/0026567 | A1 | 2/2007 | Beer et al. |
| 2007/0096295 | A1 | 5/2007 | Burtzlaff et al. |
| 2009/0243097 | A1 | 10/2009 | Koroku et al. |
| 2010/0246152 | A1 | 9/2010 | Lin et al. |
| 2011/0018116 | A1 | 1/2011 | Feng |
| 2011/0042799 | A1 | 2/2011 | Kang et al. |
| 2011/0189822 | A1 | 8/2011 | Sasaki et al. |
| 2011/0274299 | A1 | 11/2011 | Shaw et al. |
| 2011/0304008 | A1 | 12/2011 | Yang |
| 2012/0034760 | A1 | 2/2012 | Schuderer et al. |
| 2012/0178251 | A1 | 7/2012 | Lim et al. |
| 2012/0282735 | A1 | 11/2012 | Ahn et al. |
| 2013/0161813 | A1 | 6/2013 | Miki |
| 2013/0267124 | A1 | 10/2013 | Chang et al. |
| 2014/0054796 | A1 | 2/2014 | Gong et al. |
| 2015/0007939 | A1* | 1/2015 | Sherrer .................. H05K 3/341 228/101 |
| 2015/0228557 | A1 | 8/2015 | Cheng et al. |
| 2015/0255349 | A1 | 9/2015 | Holden et al. |
| 2015/0269472 | A1 | 9/2015 | Finn et al. |
| 2016/0172275 | A1* | 6/2016 | Marchisi ............ H01L 23/3114 438/112 |
| 2017/0025356 | A1 | 1/2017 | Xue |
| 2017/0077022 | A1 | 3/2017 | Scanlan et al. |
| 2017/0084686 | A1 | 3/2017 | Wang et al. |
| 2017/0222019 | A1 | 8/2017 | Wang et al. |
| 2017/0271246 | A1* | 9/2017 | Macheiner ........ H01L 23/49513 |
| 2017/0316957 | A1 | 11/2017 | Chen et al. |
| 2017/0323840 | A1 | 11/2017 | Chiu et al. |
| 2018/0005912 | A1 | 1/2018 | Oh et al. |
| 2018/0008920 | A1 | 1/2018 | Peterson, II et al. |
| 2018/0033781 | A1 | 2/2018 | Zhou et al. |
| 2018/0068920 | A1 | 3/2018 | Leung et al. |
| 2018/0204780 | A1 | 7/2018 | Chiu et al. |
| 2018/0269138 | A1* | 9/2018 | Villamor ............... H01L 23/492 |
| 2018/0330966 | A1 | 11/2018 | Scanlan et al. |
| 2018/0342453 | A1* | 11/2018 | Ziglioli ............... H01L 23/3107 |
| 2019/0244853 | A1 | 8/2019 | Berger et al. |
| 2020/0126877 | A1 | 4/2020 | Takaoka |
| 2021/0175094 | A1* | 6/2021 | De Cruz ............. H01L 23/3171 |
| 2021/0175203 | A1* | 6/2021 | Fallourd .............. H01L 21/561 |
| 2022/0302013 | A1* | 9/2022 | Pyun ................... H01L 21/4821 |
| 2022/0344303 | A1 | 10/2022 | Fallourd et al. |
| 2022/0375840 | A1 | 11/2022 | Ory et al. |
| 2023/0178380 | A1 | 6/2023 | De Cruz et al. |

FOREIGN PATENT DOCUMENTS

| | | |
|---|---|---|
| CN | 103364455 A | 10/2013 |
| CN | 104022043 A | 9/2014 |
| CN | 105374762 A | 3/2016 |
| CN | 107808871 A | 3/2018 |
| CN | 108807197 A | 11/2018 |
| CN | 112908935 A | 6/2021 |
| EP | 1085570 A2 | 3/2001 |
| EP | 3154085 A1 | 4/2017 |
| EP | 3211670 A1 | 8/2017 |
| EP | 3282476 A1 | 2/2018 |
| JP | 2009076839 A | 4/2009 |
| KR | 2003-0008646 A | 1/2003 |
| KR | 100595885 B1 | 6/2006 |
| WO | WO 2020250660 A1 | 12/2020 |

* cited by examiner

A.

13    25

33

31

11

19b

H1

17

19

15

21

B.

L2

A    A

19

L1    21

15

17

11

T1    13

13    13

15

19

11

17

13    13    13

ELECTRONIC CHIP WITH CONTACTS

BACKGROUND

Technical Field

The present disclosure relates to the manufacture of electronic chips. More particularly, the present disclosure is directed to the manufacture of chips known as surface-mounted, that is, those having one or more connection metallizations on the side of at least one face, intended to be soldered to corresponding connection pads located on a connection face of an external device such as a printed circuit board or another chip.

Description of the Related Art

Conventionally, connection metallizations of a surface mount chip are arranged on the lower face side of the chip, that is, the side of the chip face turned toward the connection face of the external device. Once assembled, the chip's connection metallizations are thus hidden by the chip. However, for some applications, there is a need for surface mount chips that allow visual inspection of the quality of the chip solder joints and, more specifically, their metallizations on an external device. This need exists in the automotive or medical fields, for example, and, more generally, in fields where ensuring the reliability of electrical connections, once the circuits are mounted in their environment, is desired.

It would be desirable to improve certain aspects of known methods for manufacturing electronic chips, at least in part.

Making chips encapsulated in chip-scale type packages (CSP) is of particular interest. More particularly, it is sought to produce CSP-type chips that allow visual inspection of solder joint quality by observation using a camera placed above the chips.

BRIEF SUMMARY

One embodiment provides a method for manufacturing electronic chips comprising, in order:
  a. forming metal contacts on the side of a first face of a semiconductor substrate, in and on which a plurality of integrated circuits have previously been formed, each metal contact extending directly above at least two neighboring integrated circuits;
  b. depositing a first protective resin on the metal contacts and the first face of the semiconductor substrate;
  c. forming first trenches of a first width on the side of a second face of the semiconductor substrate opposite the first face, the first trenches extending between the integrated circuits over the entire thickness of the semiconductor substrate;
  d. depositing a second protective resin in the first trenches and on the second face of the semiconductor substrate;
  e. forming second trenches of a second width, less than the first width, in the second protective resin opposite the first trenches, the second trenches extending to the metal contacts; and
  f. forming third trenches of a third width, less than the second width opposite the second trenches, the third trenches extending through the metal contacts so as to individualize the electronic chips.

According to one embodiment, the method comprises a step, sometime after step b, of thinning the first protective resin so as to expose the metal contacts. According to one embodiment, this thinning of the first protection resin may occur after step d so as to expose the metal contacts after the second protective resin has been deposited on and in the first trenches and on the second face of the semiconductor substrate.

According to one embodiment, the method comprises a step, before step a, of forming re-connection studs on the side of the first face of the semiconductor substrate, the metal contacts being formed on and in contact with the re-connection studs during step a.

According to one embodiment, the metal contacts have a height of between 20 μm and 150 μm.

According to one embodiment, the third width is less than 20 μm.

According to one embodiment, the second width is between 30 μm and 310 μm.

According to one embodiment, the method comprises a step, after step a, of thinning the semiconductor substrate by its second face.

According to one embodiment, said step of thinning the semiconductor substrate is carried out before step c.

According to one embodiment, said step of thinning the semiconductor substrate is carried out after step d.

One embodiment provides for an electronic chip comprising an integrated circuit formed in and on a semiconductor substrate, the flanks of the substrate being coated with a second protective resin, the chip comprising at least one metal contact arranged on a first face of the semiconductor substrate and extending laterally beyond the flanks of the second protective resin.

According to one embodiment, said at least one metal contact has a flat connection face extending continuously in part under the semiconductor substrate and extending laterally beyond the flanks of the second protective resin.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the making of the integrated circuits present in the described electronic chips has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation of the cross-sectional views of the corresponding Figures, unless indicated otherwise.

Unless specified otherwise, the expressions "around", "approximately", "substantially" and "in the order of" signify within 10%, and preferably within 5%.

Surface mount chips with connecting metallizations that extend to the chip flanks have already been proposed. These are referred to as wettable flank chips. When the chip is mounted on an external device such as a printed circuit board, the chip connection metallizations are soldered or brazed to corresponding metal tracks or elements of the external device. Some of the solder material then rises up the chip flanks, making it possible to visually inspect the solder quality.

A wettable flank chip typically has connection metallizations of a relatively large height (thickness), so that the chip soldering can be easily inspected.

This height may restrict the miniaturization possibilities of electronic circuits based on such chips.

According to one aspect of the embodiments described below, it is contemplated that the connection metallizations are extended horizontally outside the chip housing. This makes it possible to visually inspect the connection quality while limiting the thickness of the connection metallizations of the chip.

Figures 1, 2, 3:
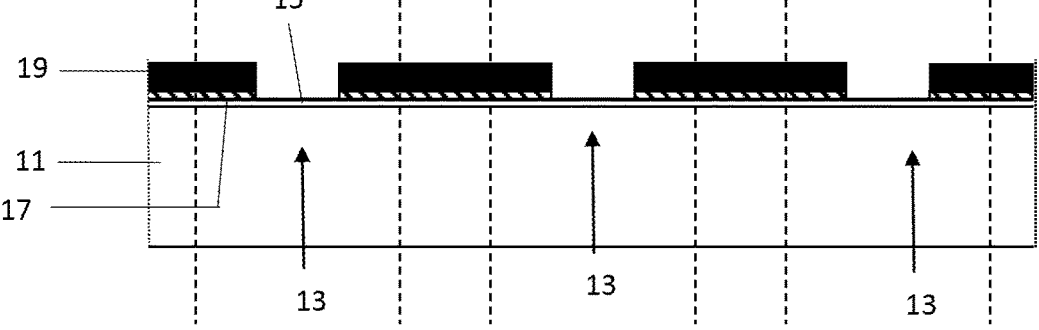
FIG. 1 illustrates an example of one embodiment of a surface mount electronic chip, by a cross-sectional view and a view from below.
FIG. 2 illustrates one step of an example of a method for manufacturing the electronic chip illustrated in FIG. 1, by a cross-sectional view.
FIG. 3 illustrates another step of an example method for manufacturing the electronic chip illustrated in FIG. 1, by a cross-sectional view.

FIG. 1 illustrates one embodiment of an electronic chip by a cross-sectional view A and a view B from below, view A being a cross-sectional view according to the cross-sectional plane AA of view B.

The electronic chip 1 comprises a semiconductor substrate 11 in and on which an integrated circuit 13 is formed. The substrate 11 is made of a semiconductor material, such as silicon. On the side of its lower face (in the orientation of view A), the substrate 11 is coated by and in contact with a stack of insulating and conductive layers 15, called an interconnection stack, in which interconnection elements of components of the circuit 13 may be formed. The interconnection stack 15 further comprises one or more electrically conductive re-connection studs 17, metallic, for example, opening at the surface of the interconnection stack 15. In the example shown, the chip includes six studs 17. However, the described embodiments are not limited to this particular case. In a variant, the chip 1 may include a number of studs 17 other than six, such as five studs 17 or eight studs 17. The studs 17 are located at the periphery of the interconnection stack 15, as shown in FIG. 1. The spacing between two studs 17 is greater than 50 μm, for example.

The studs 17 extend laterally beyond the structure formed by the substrate 11 and the interconnection stack 15. In other words, the lateral edges of the structure formed by the substrate 11 and the interconnection stack 15 are not aligned with the lateral edges of the studs 17.

The structure formed by the substrate 11 and the interconnection stack 15 has a parallelepiped shape, for example.

The chip 1 shown in FIG. 1 further comprises connection metallizations or metal contacts 19. Each metal contact 19 is formed on and in contact with a re-connection stud 17. The studs 17 are preferably all covered by at least a portion of a metal contact 19. The metal contacts 19 extend laterally beyond flanks 31 of the structure formed by the substrate 11 and the interconnection stack 15. The portions of the structure formed by the substrate 11, the interconnection stack 15 and the re-connection studs 17 that are not covered by a metal contact 19 are covered by an electrically insulating protective resin, forming a chip housing. For example, the upper face and a portion of the lateral edges of the structure are covered by a resin region 25 and a portion of the lower surface of the structure is covered by a resin region 21. As an example, the protective resin leaves only the metal contacts 19 of the chip exposed. In this example, the metal contacts 19 are flush with the lower face side, which is based on the orientation of the chip 1 as shown in FIG. 1, of the resin region 21.

According to one aspect of the described embodiments, the metal contacts 19 extend laterally beyond the flanks 33 (e.g., sidewalls, side surfaces, etc.) of the housing formed by the protective resin. As an example, when viewed from below, a portion 19*b* of each metal contact 19 extends beyond the flanks of the housing over a distance L1 of between 10 μm and 150 μm (in a direction orthogonal to the flank of the chip housing), for example. In other words, each metal contact 19 extends partially under the substrate 11 and extends laterally beyond the chip housing. Thus, each metal contact 19 has a flat, lower connection face extending continuously, partially under the substrate 11, and extending laterally beyond the flanks of the chip housing.

The brackets 19*b* protruding from the flanks of the chip 1 form connection brackets, making it possible to visually inspect the quality of the chip connections at an external device.

The length L2 of the portions of the metal contacts 19 located under the chip housing is greater than 50 μm, for example. As shown in the embodiment of the chip 1 in FIG. 1, the length L2 is greater than the length L1.

The soldering of the chip 1 to an external device shown in FIG. 1 is performed by depositing a solder on the lower face of the metal contacts 19, for example.

One advantage resulting from the presence of the brackets 19*b* of the connection metallizations 19 projecting from the flanks of the chip housing 1 is that visual control of the soldering quality is possible when soldering the chip 1 to an external device. In particular, during assembly, a portion of the solder material can rise up on the flanks and on the upper face of the brackets 19*b*, which facilitates visual inspection of the connection.

FIGS. 2 to 9 are cross-sectional views illustrating successive steps of an example method for manufacturing electronic chips of the type described in connection with FIG. 1.

FIG. 2 is a cross-sectional view of a structure including the semiconductor substrate 11 in and on which integrated circuits 13 have been previously formed. The circuits 13 are all identical, within manufacturing dispersions, for example. The substrate 11 may correspond to a wafer of a semiconductor material such as silicon. The substrate 11 has a thickness T1 of between 50 μm and 900 μm, for example, between 50 μm and 500 μm for example, a thickness of about 500 μm, for example.

The structure of FIG. 2 further comprises the interconnection stack that includes insulating and conductive layers coating the upper face of the substrate 11. The insulating and conductive layers of the interconnection stack 15 may be stacked on each other, respectively, for example, the interconnection stack 15 may include one or more insulating layers and one or more conductive layers stacked on each other, respectively. The interconnection stack 15 further comprises re-connection studs 17 for each integrated circuit 13. Each one of the re-connection studs 17 may be on the upper face of a corresponding one of the metal contacts 19. The re-connection studs 17 are common to several integrated circuits 13, for example. The same re-connection stud 17 extends over at least two adjacent integrated circuits 13, for example, as well as over a cut-out area located between the two integrated circuits. The re-connection studs 17 may comprise a stack of one or more metal layers. For example, the reconnection studs 17 are under bump metallizations (UBM).

Each integrated circuit 13 comprises one or more electronic components (transistors, diodes, thyristors, triacs, etc.), for example.

In FIG. 2, three integrated circuits 13 are shown, with the understanding that the number of integrated circuits 13 formed in and on the substrate 11 may differ from than three. In practice, the substrate 11 is a wafer of a semiconductor material such as silicon, and several tens or even several hundreds or thousands of integrated circuits 13 are formed in and on the substrate 11. The integrated circuits 13 are then organized in an array in rows and columns in a regular grid pattern, for example.

In the remainder of this description, in the orientation of FIG. 2, the lower face of the structure is considered as being the rear face and the upper face of the structure is considered as being the front face.

FIG. 3 illustrates a step of forming the metal contacts 19 on the front side of the structure illustrated in FIG. 2, by a cross-sectional view.

More particularly, in the step illustrated in FIG. 3, a metal contact 19 is formed in line with each contact re-connection stud 17, on and in contact with the stud 17. The metal contacts 19 cover the entire surface of the contact re-connection stud 17, for example. As an example, when viewed from above, the contours of the metal contacts 19 coincide with the contours of the re-connection studs 17.

The metal contacts 19 are made by electrolytic growth from the upper face of the studs 17, for example. The height (thickness) of the metal contacts 19 is greater than or equal to 20 μm, for example, such as greater than or equal to 50 μm. As an example, the height H1 of the metal contacts 19 is between 20 μm and 150 μm.

The metal contacts 19 may be made of a tin-based alloy, such as a tin/silver (SnAg) based alloy. In a variant, the metal contacts 19 may be copper, gold, silver, a nickel-based alloy such as a nickel palladium and/or nickel electrolytic gold alloy or any alloy based on one or more of these materials.

Figure 4:
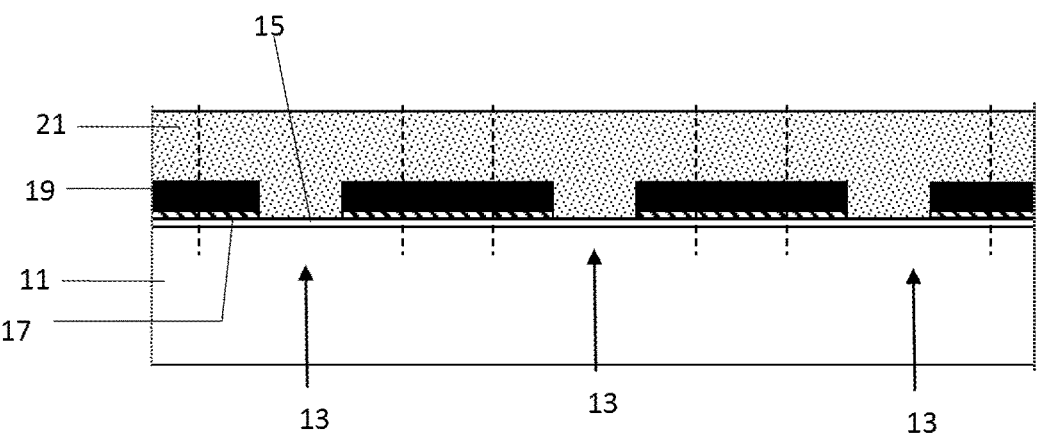
FIG. 4 illustrates yet another step of an example of a method for manufacturing the electronic chip illustrated in FIG. 1, by a cross-sectional view.

FIG. 4 illustrates a step of depositing a protective resin 21 on the front face of the structure illustrated in FIG. 3 by a cross-sectional view.

During this step, the front face of the structure, and in particular the metal contacts 19 and the upper face of the stack 15 are completely covered (full plate) by the resin 21. The resin 21 is an epoxy resin, for example. The resin 21 provides electrical insulation of the front face of the final chip (that is, the lower face in the orientation of view A in FIG. 1). The resin 21 may be referred to as a first resin, a first resin layer, a first protective resin layer, or may be referred to with some other suitable type of reference to the resin 21.

The resin 21 preferably has a relatively large thickness so as to stiffen the structure for subsequent steps. The resin 21 then serves as a mechanical support for the following steps and the cutting steps, in particular. As an example, the resin 21 is deposited with a thickness of between 100 μm and 500 μm, from the upper face of the stack 15.

Figure 5:
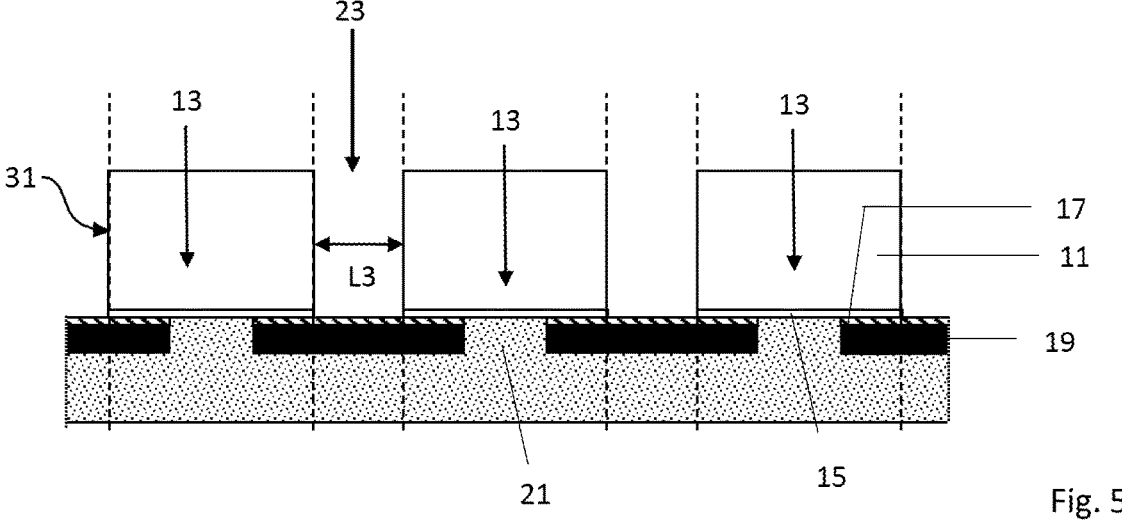
FIG. 5 illustrates yet another step of an example of a method for manufacturing the electronic chip illustrated in FIG. 1, by a cross-sectional view.

FIG. 5 illustrates a step of forming first cutting trenches 23 from the rear face of the structure illustrated in FIG. 4 by a cross-sectional view.

It should be noted, in the example of FIG. 5, that the structure orientation is reversed in relation to the cross-sectional views of the previous Figures.

As an example, in the step of forming the trenches 23, the structure is supported by a support film, not shown, arranged on the lower face of the resin layer 21 in the orientation of FIG. 5.

The trenches 23 extend between the circuits 13 such that each circuit 13 is laterally separated from its neighbor by a trench 23. By way of example, each circuit 13 is entirely delimited laterally by the trenches 23. The trenches 23, viewed from above, may form a continuous grid extending between the integrated circuits 13, for example.

In the example shown, the trenches 23 extend vertically from the rear face of the substrate 11 (that is, the upper face in the orientation of FIG. 5) and extend into the substrate 11 at least through the thickness of the substrate 11. The trenches 23 extend into all or part of the thickness of the stack 15, for example, and into all or part of the thickness of the studs 17, for example. The trenches 23 open onto or into the studs 17, for example. In a variant, the trenches 23 open onto or into the metal contacts 19. In the example shown, the trenches 23 open onto the upper face of the studs 17, that is, on the face of the studs 17 opposite the metal contacts 19.

The trenches 23 are made by plasma cutting, for example. In a variant, the trenches 23 are made by sawing with a blade.

The trenches 23 have a width L3 of between 50 μm and 400 μm, for example.

Figure 6:
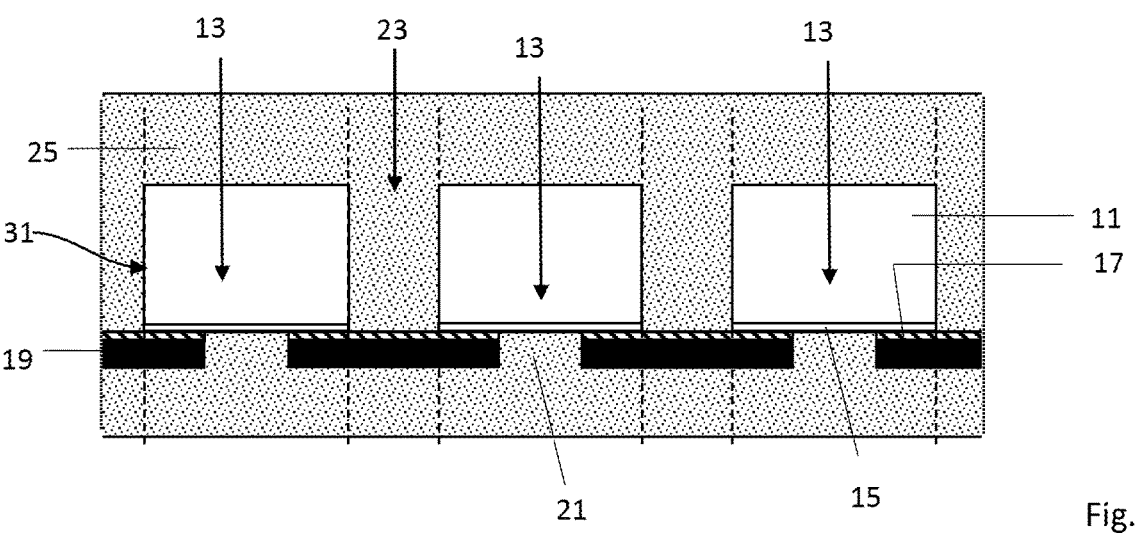
FIG. 6 illustrates yet another step of an example of a method for manufacturing the electronic chip illustrated in FIG. 1, by a cross-sectional view.

FIG. 6 illustrates a step of depositing a protective resin 25 on the rear face of the structure illustrated in FIG. 5 by a cross-sectional view. The protective resin 25 may be referred to as a second resin, a second resin layer, a second protective resin layer, or some other suitable type of reference to the protective resin 25.

During this step, the upper face of the structure illustrated in FIG. 5 is completely covered (full plate) by the resin 25 and, in particular, the trenches 23 are filled and the rear face of the substrate 11 (upper face of the substrate 11 in the orientation of FIG. 6) is covered. The resin 25 is identical to the resin 21, for example. In a variant, the resins 21 and 25 may be different. The resin 25 is an epoxy resin, for example. The resin 25 electrically insulates the edges and the rear face (that is, the upper face in the orientation of view A of FIG. 1) of the final chip and more particularly the semiconductor substrate 11.

Figure 7:
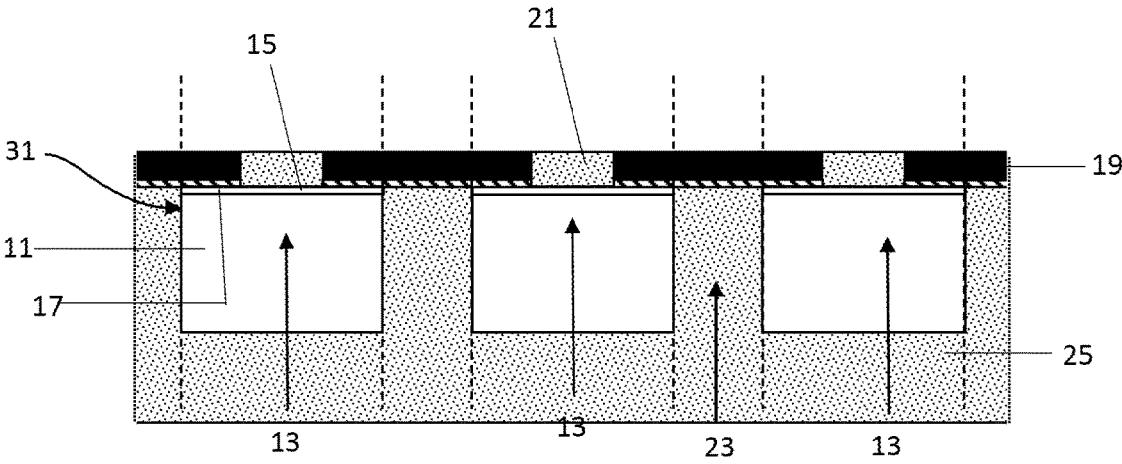
FIG. 7 illustrates yet another step of an example of a method for manufacturing the electronic chip illustrated in FIG. 1, by a cross-sectional view.

FIG. 7 illustrates a step of planarizing the front face of the structure illustrated in FIG. 6 by a cross-sectional view.

It should be noted that in the example of FIG. 7, the structure orientation is reversed in relation to the cross-sectional views of FIGS. 5 and 6.

During this step, part of the thickness of the resin 21 is removed, so as to expose the metal contacts 19. The planarization is carried out by mechanical polishing or by chemical mechanical polishing (CMP), for example.

At the end of this step, the metal contacts 19 are no longer covered by the resin 21 and the resin 21 remains only between the metal contacts 19. Thus, respective faces of the metal contacts 19 are substantially flush or coplanar with the lower face of the resin 21 in the orientation shown in FIG. 7.

Figure 8:
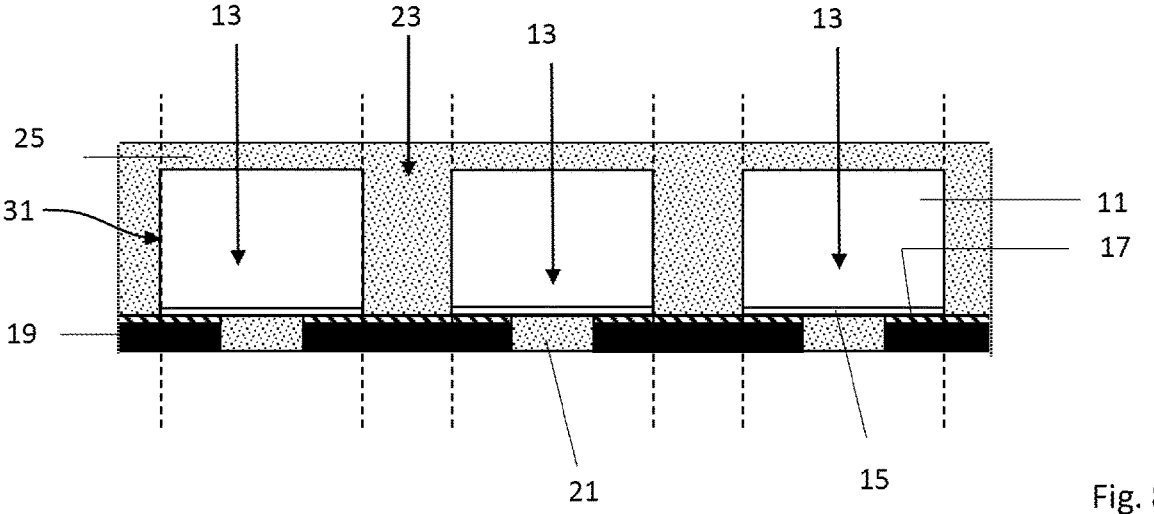
FIG. 8 illustrates, yet another step of an example method for manufacturing the electronic chip illustrated in FIG. 1, by a cross-sectional view.

FIG. 8 illustrates, by a cross-sectional view, an optional step of thinning the structure illustrated in FIG. 7 by the rear face.

It should be noted that in the example of FIG. 8, the structure orientation is reversed in relation to the cross-sectional view of FIG. 7.

In this step, a portion of the thickness of the resin 25 is removed. The thinning is performed by mechanical polishing or by chemical/mechanical polishing, for example.

At the end of the step illustrated in FIG. 8, the thickness of the structure is equal to the desired thickness of the electronic chips.

In the example shown, the thinning is interrupted before reaching the rear face of the substrate 11. Thus, a protective resin layer 25 remains on the rear face of the substrate 11.

In a variant, if the thickness of the substrate 11 is too great in relation to the desired final chip thickness, thinning can be continued until some thickness of the substrate 11 is removed from its rear face (that is, its upper face in the orientation of FIG. 8). The thinning can then be followed by a step of depositing a third protective resin on the upper face of the structure, to protect the rear face of the thinned substrate 11. The third resin is identical to the second resin 25, for example. In a variant, the third resin may be different from the second resin. The third resin is epoxy, for example. In a variant, the third resin may be replaced by another protective material such as a solid film or any other organic or inorganic material deposited by spraying, for example.

In another embodiment, the step of thinning the substrate 11 can be performed before forming the trenches 23, such as after depositing the resin 21. In one embodiment, the step of thinning the substrate 11 may be performed prior to the step of depositing the first resin 21.

Figure 9:
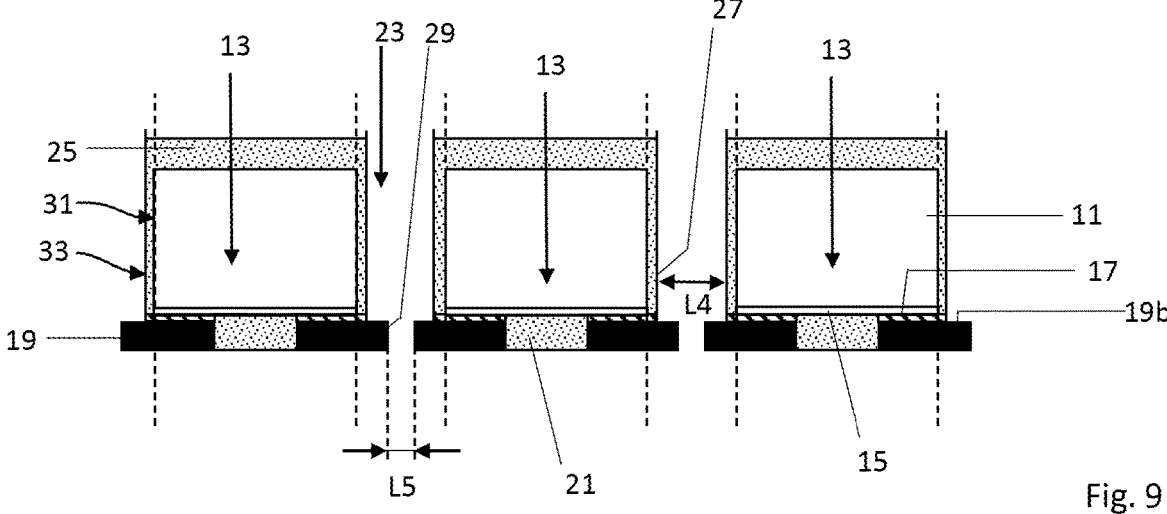
FIG. 9 illustrates yet another step of an example method for manufacturing the electronic chip illustrated in FIG. 1, by a cross-sectional view.

FIG. 9 illustrates a step of forming second 27 and third 29 cutting trenches from the rear face of the structure illustrated in FIG. 8 by a cross-sectional view.

At the end of the step illustrated in FIG. 9, the structure corresponds to individual chips, each comprising a single integrated circuit 13. Prior to this step, the structure is attached by its front face (lower face in the orientation of FIG. 9) on a support film, not shown in FIG. 9.

In this step, second trenches 27 are first formed in the protective resin 25 opposite the first trenches 23. The trenches 27 are formed opposite all the trenches 23, along their entire length. The trenches 27 extend into the resin 25 as far as the re-connection studs 17 or the metal contacts 19.

In other words, the second trenches extend from the upper face of the structure illustrated in FIG. 9 through the entire thickness of the resin 25. The trenches 27 open on or in the re-connection studs 17, for example. In a variant, the trenches 27 open onto or into the metal contacts 19.

The trenches 27 have a width L4. The width L4 is less than the width L3, so that the substrate 11 of each chip remains covered by the resin 25 on its four lateral faces. The trenches 27 can be made by sawing, for example, using a cutting blade of a smaller width than that used to make the trenches 23. In a variant, the trenches 27 can be made by laser ablation. The trenches 27 and the trenches 23 are aligned along the same central axis, for example.

In order to cut the structure into individual chips with each comprising a single integrated circuit 13, third trenches 29 are formed opposite the second trenches 27 in the metal contacts 19. More particularly, a trench 29 is formed opposite each second trench 27, parallel to said trench 27. In this example, the trenches 29 extend along the entire length of the trenches 27. The trenches 29 extend vertically so that the metal contacts 19 and the studs 17, if applicable, are cut opposite the second trenches 27. The trenches 29 have a width L5 that is less than the width L4, such that each metal contact in each chip has a free bracket 19b that protrudes from the flank of the lateral protective resin layer 25 of the chip housing.

The trenches 29 may be made by sawing, for example, using a cutting blade of a lesser width than that used to make the trenches 27. In a variant, the trenches 29 may be made by laser ablation.

In this example, the difference between the widths L4 and L5 is chosen to be sufficiently large to allow the brackets 19b of the metal contacts 19 to be freed, on the one hand; on the other hand, the width L5 must be small enough so that a maximum number of chips can be made from a single semiconductor wafer. The difference between the widths L4 and L5 is twice the length L1 of the brackets 19b.

The width L5 is less than 20 μm, for example, preferably of the order of 10 μm or even less than 10 μm. The width L4 is then preferably between 30 μm and 310 μm so that the difference between the widths L4 and L5 is between 20 μm and 300 μm, that is, a bracket length L1 of between 10 μm and 150 μm.

At the end of this step, the structure obtained corresponds to a plurality of electronic chips, connected only by the support film (not shown in FIG. 9). The chips can then be taken from this support film, with a view to mounting them in an external device.

One advantage of the described embodiments and implementation methods is that they allow for easy mounting of the electronic chips on a printed circuit board.

Another advantage of the described embodiments and implementation methods is that they allow for visual inspection of the solder joint when mounting the chips on a printed circuit board, without the use of expensive techniques such as X-ray inspection techniques.

Another advantage of the described embodiments and implementation methods is that they allow for a reduction in the thickness of surface mount chips and, therefore, the thickness of printed circuit boards.

Another advantage of the described embodiments and implementation methods is that they allow for making small-sized electronic chips that have lateral electrical connection brackets. In particular, this makes it possible to produce electrical connection lateral brackets without the need for a relatively bulky metal support frame.

Various embodiments and variants have been described. The person skilled in the art will understand that certain features of these various embodiments and variants could be combined, and other variants will be apparent to the person skilled in the art. In particular, the described embodiments are not limited to the above-mentioned examples of dimensions and materials.

The described embodiments are also not limited to the particular arrangement of the re-connection studs 17 and metal contacts 19 shown in the Figures. In a variant, in addition to the metal contacts 19 located at the periphery of the chip, having brackets 19b extending laterally beyond the chip housing, each chip may comprise one or more metal contacts located in a central portion of the connection face of the chip, these contacts then having no lateral overhang. The quality of the connection of these central metal contacts to the external device cannot then be checked directly by visual inspection. However, in practice, the inspection of the quality of the connections of the peripheral contacts may be sufficient to detect possible assembly defects. If necessary, the quality of the connections of the central metal contacts can be checked by X-ray inspection techniques.

The metal contacts 19 may be referred to as conductive contacts, electrical contacts, or some other similar or suitable type of reference to the metal contacts 19.

Finally, the practical implementation of the embodiments and variants described herein is within the capabilities of those skilled in the art based on the functional description provided hereinabove.

A method for manufacturing electronic chips (1) may be summarized as including, in order:

a. forming metal contacts (19) on the side of a first face of a semiconductor substrate (11) in and on which a plurality of integrated circuits (13) have previously been formed, each metal contact extending directly above least two neighboring integrated circuits;

b. depositing a first protective resin (21) on the metal contacts (19) and the first face of the semiconductor substrate (11);

c. forming first trenches (23) of a first width (L3) on the side of a second face of the semiconductor substrate (11) opposite the first face, the first trenches (23) extending between the integrated circuits (13) over the entire thickness of the semiconductor substrate (11);

d. depositing a second protective resin (25) in the first trenches (23) and on the second face of the semiconductor substrate (11);

e. forming second trenches (27) of a second width (L4), less than the first width (L3), in the second protective resin (25) opposite the first trenches (23), the second trenches extending to the metal contacts (19); and f. forming third trenches (29) of a third width (L5), less than the second width (L4), opposite the second trenches (27), the third trenches extending through the metal contacts (19) so as to individualize the electronic chips (1).

The method may include a step, after step b, of thinning the first protective resin (21) so as to expose the metal contacts (19). The thinning of the first protective resin (21) so as to expose the metal contacts (19) may occur after step d. The method may include a step, prior to step a, of forming re-connection studs (17) on the side of the first face of the semiconductor substrate (11), the metal contacts (19) being formed on and in contact with the re-connection studs (17) during step a. The metal contacts (19) may have a height of between 20 μm and 150 μm. The third width (L5) may be less than 20 μm. The second width (L4) may be between 30 μm and 310 μm.

The method may further include a step, after step a, of thinning the semiconductor substrate (11) by its second face. Said step of thinning the semiconductor substrate (11) may be carried out before step c. Said step of thinning the semiconductor substrate (11) may be carried out after step d.

An electronic chip (1) may be summarized as including an integrated circuit (13) formed in and on a semiconductor substrate (11), the flanks of the substrate being coated with a second protective resin (25), the chip comprising at least one metal contact (19) arranged on a first face of the semiconductor substrate (11) and extending laterally beyond the flanks of the second protective resin (25). Said at least one metal contact (19) may have a flat connection face extending continuously in part under the semiconductor substrate (11) and extending laterally beyond the flanks of the second protective resin (25).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:

a first side and a second side opposite to the first side;

a first resin at the first side, the first resin including a first flank;

a second resin at the second side, the second resin is different from the first resin, and the second resin includes a second flank coplanar with the first flank;

a substrate in the first resin and encased between the first resin and the second resin, the substrate including an integrated circuit;

an interconnection stack on the substrate, the interconnection stack partially covered by the second resin;

a metal contact at the second side, the metal contact includes a bracket portion that protrudes from the first flank of the first resin, the metal contact includes:

an encased portion in the second resin, the encased portion having a first end surface covered by second resin; and a bracket portion that extends outward from the flank of the first resin; and a reconnection stud extending from the encased portion to the interconnection stack, the reconnection stud coupling the interconnection stack to the metal contact, and the reconnection stud including a third flank coplanar with the first flank and the second flank, and a second end surface opposite to the third flank and coplanar with the first end surface.

2. The device of claim 1, wherein the reconnection stud is partially covered by the second resin.

3. The device of claim 1, wherein:

the encased portion has a first length that extends from the bracket portion to a first end of the encased portion in the second resin, the first length is transverse to the flank of the first resin; and the bracket portion has a second length that extends from the flank of the first resin to a second end of the bracket portion opposite to the first end of the encased portion, the second length is less than the first length, the second length is transverse to the flank of the first resin.

4. The device of claim 1, wherein the metal contact is one of a plurality of metal contacts.

5. A device, comprising:

a first side and a second side opposite to the first side;

a first resin layer that is at the first side, the first resin layer includes a first face and a first flank transverse to the first face;

a second resin layer at the second side, the second resin layer includes a second flank transverse to the first face, and the second flank is coplanar with the first flank;

a metal contact at the first side, the metal contact includes:
    a second face flush with the first face of the first resin layer;
    a third face opposite to the second face; and
    a bracket portion that protrudes from the flank;

a reconnection stud that is on the third face of the metal contact, the reconnection stud includes a third flank that is coplanar with the first flank and the second flank, and the reconnection stud includes an end surface that is exposed from the first resin layer and the second resin layer;

an interconnection stack that is on the reconnection stud; and a substrate including an integrated circuit that is within the second resin layer and is on the interconnection stack.

6. The device of claim 5, wherein:

the metal contact portion further includes an encased portion in the second resin layer, the encased portion has a first length that extends from the bracket portion to a first end of the encased portion in the second resin layer, the first length is transverse to the flank of the first resin layer; and the bracket portion has a second length that extends from the flank of the first resin layer to a second end of the bracket portion opposite to the first end of the encased portion, the second length is less than the first length, the second length is transverse to the flank of the first resin layer.

7. The device of claim 5, wherein the metal contact is one of a plurality of metal contacts.

8. The device of claim 5, wherein the first resin layer has a first height and the second resin layer has a second height, and the first height is greater than the second height.

9. The device of claim 5, wherein the integrated circuit is encased within the first resin layer and the second resin layer.

10. The device of claim 5, wherein the integrated circuit is coupled to the metal contact through the reconnection stud and the interconnection stack.

11. A device, comprising:

a first side and a second side opposite to the first side;

a first protective resin at the first side, the first protective resin including one or more first flanks;

a second protective resin at the second side, the second protective resin includes one or more second flanks, and the one or more second flanks are coplanar with the one or more first flanks;

a substrate that has a first surface, a second surface opposite to the first surface, and one or more third flanks that extend from the first surface to the second surface, the substrate includes an integrated circuit, and the one or more third flanks and the second surface are covered by the first protective resin;

an interconnection stack on the first surface of the substrate, and the interconnection stack is at least partially covered by the second protective resin;

a reconnection stud on the interconnection stack, the reconnection stud includes a fourth flank that is coplanar with a corresponding first flank of the one or more first flanks of the first protective resin and a corresponding second flank of the one or more second flanks of the second protective resin, and the fourth flank is exposed from the first protective resin and the second protective resin; and a metal contact coupled to the reconnection stud, the metal contact includes a bracket portion that protrudes outward and beyond a corresponding first flank of the one or more first flanks and a portion of the metal contact is within the second protective resin.

12. The device of claim 11, wherein the second protective resin at the second side includes one or more third flanks, and the one or more third flanks are coplanar with the one or more first flanks of the first protective resin.

13. The device of claim 12, wherein the metal contact protrudes outward and beyond a corresponding third flank of the one or more third flanks.

14. The device of claim 13, wherein the reconnection stud fully covers the portion of the metal contact within the second protective resin.

15. The device of claim 13, wherein the first protective resin and the second protective resin are made of different materials.

16. The device of claim 11, wherein the reconnection stud fully covers the portion of the metal contact within the second protective resin.

17. The device of claim 11, wherein the first protective resin and the second protective resin are made of the same material.

18. The device of claim 11, wherein the first protective resin and the second protective resin are made of different materials.

19. The device of claim 11, wherein:

the portion of the metal contact within the second protective resin has a first length that extends from the bracket portion to a first end of the portion of the metal contact that terminates within the second protective resin, and the first length is transverse to the one or more first flanks; and the bracket portion of the metal contact has a second length that extends from the corresponding first flank of the one or more first flanks from which the bracket portion protrudes outward and beyond, the second length is different from the first length, and the second length is transverse to the one or more first flanks.

20. The device of claim 19, wherein the second length is less than the first length.

* * * * *